(12) United States Patent
Jeong

(10) Patent No.: US 7,687,359 B2
(45) Date of Patent: Mar. 30, 2010

(54) METHOD FOR FABRICATING FLASH MEMORY DEVICE

(75) Inventor: Dae Ho Jeong, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 52 days.

(21) Appl. No.: 11/953,605

(22) Filed: Dec. 10, 2007

(65) Prior Publication Data

US 2008/0153230 A1 Jun. 26, 2008

(30) Foreign Application Priority Data

Dec. 22, 2006 (KR) ............... 10-2006-0132345
Dec. 23, 2006 (KR) ............... 10-2006-0133260

(51) Int. Cl.
*H01L 21/336* (2006.01)

(52) U.S. Cl. ............... 438/287; 438/792; 257/E21.625; 257/E21.576

(58) Field of Classification Search ............... 438/287, 438/792; 257/E21.625, E21.576, E21.477, 257/E21.478
See application file for complete search history.

(56) References Cited

U.S. PATENT DOCUMENTS

2001/0040252 A1* 11/2001 Kobayashi et al. .......... 257/314
2002/0040847 A1* 4/2002 Ohmi et al. ............ 204/192.22
2003/0073290 A1* 4/2003 Ramkumar et al. ......... 438/287
2004/0106255 A1 6/2004 Mitsuhira
2004/0140510 A1* 7/2004 Hazama ..................... 257/390
2005/0213391 A1* 9/2005 Lojek .................... 365/185.29
2007/0298623 A1* 12/2007 Spencer et al. ............. 438/791
2008/0096364 A1* 4/2008 Wilson et al. .............. 438/424

FOREIGN PATENT DOCUMENTS

KR 10-2004-0046341 6/2004

* cited by examiner

*Primary Examiner*—Caridad M Everhart
(74) *Attorney, Agent, or Firm*—Workman Nydegger

(57) ABSTRACT

The present invention relates to a method for fabricating flash memory devices. The method may include the steps of forming an oxide/nitride/oxide (ONO) layer over a semiconductor substrate and a gate electrode on the ONO layer. Next, source/drain impurity region may be formed in a surface of the semiconductor substrate on both sides of the gate electrode and a pre-metal dielectric (PMD) layer may be formed over an entire surface of the semiconductor substrate including the gate electrode. Finally, a densification process for densifying the PMD layer may be performed under a gas atmosphere. A densification gas atmosphere used for densifying the PMD layer may include an $H_2$ or $N_2/H_2$ atmosphere.

12 Claims, 3 Drawing Sheets

METHOD FOR FABRICATING FLASH MEMORY DEVICE

CROSS-REFERENCE TO RELATED APPLICATION

This application claims priority to Korean Application No. 10-2006-0132345, filed on Dec. 22, 2006, and to Korean Application No. 10-2006-0133260, filed on Dec. 23, 2006, each of which are incorporated herein by reference in their entirety.

BACKGROUND

1. Field of the Invention

The present invention relates to a method for fabricating flash memory devices.

2. Background of the Invention

In general, a representative example of a flash memory device, that is, a non-volatile memory device whose data is not lost even when power is not supplied to the device, includes electrically erasable and programmable read only memory (EEPROM).

EEPROM is an electrically rewritable non-volatile memory device and generally has a structure employing a stacked floating-gate cell.

In recent years, as the level of integration rapidly increases, there is an urgent need for a reduction in size of the conventional floating gate cell. However, the conventional floating gate cell requires a high voltage upon program/erasure and therefore cannot be shrunk past a certain level.

For this reason, extensive research has been done on non-volatile memory devices and various replacements for the conventional floating gate cell have been proposed, such as Semiconductor-Oxide-Nitride-Oxide-Semiconductor (SONOS) cells, Ferroelectric Random Access Memory (Fe-RAM) cells, and Nitride Read Only Memory (NROM).

Of these, the SONOS cell has been perceived by many as the next-generation cell that will replace the stacked floating-gate cell.

A flash memory device of a conventional SONOS structure is described below with reference to FIG. 1.

FIG. 1 is a cross-sectional view of a flash memory device of a conventional SONOS structure.

As shown in FIG. 1, the SONOS device may include a p-type semiconductor substrate 10. A tunnel oxide layer 12, a trap nitride layer 13, a block oxide layer 14, and a gate electrode 15 of a N+ type polysilicon component, may be formed over a specific region of the semiconductor substrate 10.

The tunnel oxide layer 12, the trap nitride layer 13, and the block oxide layer 14 may be stacked to form an oxide/nitride/oxide (ONO) layer.

First and second insulating layer sidewalls 16 and 17 may be formed on both sidewalls of the gate electrode 15. A light doped drain (LDD) region 18 and a source/drain impurity region 19 may be formed in the semiconductor substrate 10 on both sides of the gate electrode 15.

A metal silicide layer 20 may be formed on the surfaces of the gate electrode 15 and the source/drain impurity region 19. An etch-stop layer 21 may be formed on the entire surface of the semiconductor substrate 10 including the metal silicide layer 20. A pre-metal dielectric (PMD) layer 22 may be formed on the etch-stop layer 21.

In the fabrication process of the conventional SONOS device, after the etch-stop layer 21 is formed, the PMD layer 22 may be formed from borophosphosilicate glass (BPSG) or phosphosilicate glass (PSG) and a densification process may be carried out.

The densification process can employ an annealing process under nitrogen atmosphere at a temperature of 600° C. to 900° C. for 10 minutes to 5 hours, or a rapid thermal annealing (RTA) process under nitrogen atmosphere at a temperature of 700° C. to 1000° C. for 10 to 60 seconds.

After the PMD layer 22 is formed, a low-temperature process of 400° C. or less may be performed. A sintering process may be performed under $H_2/N_2$ or $H_2$ atmosphere at a temperature of 400° C. to 435° C. anterior or posterior to wire bonding and pad-open processes, so that dangling bonds, shallow traps and/or interface traps existing at the interface of the ONO layer or the interface of the semiconductor substrate and the tunnel oxide layer are terminated by infiltrated hydrogen. Accordingly, the electrical properties of the SONOS device can be stabilized.

As described above, in the fabrication method of the flash memory device, in the case of the ONO deposition process, the block oxide layer 14 is deposited immediately after the tunnel oxide layer 12 and the trap nitride layer 13 are deposited. Thus, numerous dangling bonds, interface states, shallow traps and/or defects exist at the interface of the trap nitride layer 13 and the block oxide layer 14.

This incomplete interface makes the program/erase characteristics of the SONOS device unstable, e.g., reducing a threshold voltage (Vt) window. This makes it impossible to use the device as a memory device. Further, a retention characteristic (that is, a charge retention ability) and a durability characteristic (that is, a read and write ability) are depreciated, lowering reliability of the device.

In the fabrication method of the SONOS device, it is difficult to raise the temperature of the sintering process to 435° C. or more. Accordingly, not only it is difficult to infiltrate hydrogen into the ONO layer of the SONOS device, but also a probability of the infiltrated hydrogen being combined with dangling bonds, shallow traps and/or interface traps is lowered. Consequently, the stabilization of electrical properties of the SONOS device, such as program and erase characteristics, retention ability, and durability, is limited.

SUMMARY OF SOME EXAMPLE EMBODIMENTS

In general, example embodiments of the invention relate to a method for fabricating flash memory devices in which hydrogen can easily infiltrate an ONO layer of a SONOS device and a probability of the infiltrated hydrogen being combined with dangling bonds, shallow traps, and/or interface traps is increased, thereby stabilizing the electrical properties of the SONOS device.

Example embodiments of the invention also relate to a method for fabricating flash memory devices in which a threshold voltage window is widened due to stabilized program/erase characteristics of a SONOS device, improving the yield and reliability of the flash memory devices.

In accordance with example embodiments, there is provided a method for fabricating a flash memory device, including the steps of forming an ONO layer over a semiconductor substrate, forming a gate electrode on the ONO layer, forming a source/drain impurity region in a surface of the semiconductor substrate on both sides of the gate electrode, forming a PMD layer over an entire surface of the semiconductor substrate including the gate electrode, and performing a densification process for densifying the PMD layer under a gas atmosphere.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Hereinafter, aspects of example embodiments of the present invention will be described in detail with reference to the accompanying drawings so that they can be readily implemented by those skilled in the art.

FIGS. 2A to 2D are cross-sectional views illustrating a method for fabricating a flash memory device of a SONOS structure in accordance with an example embodiment.

Figure 1:
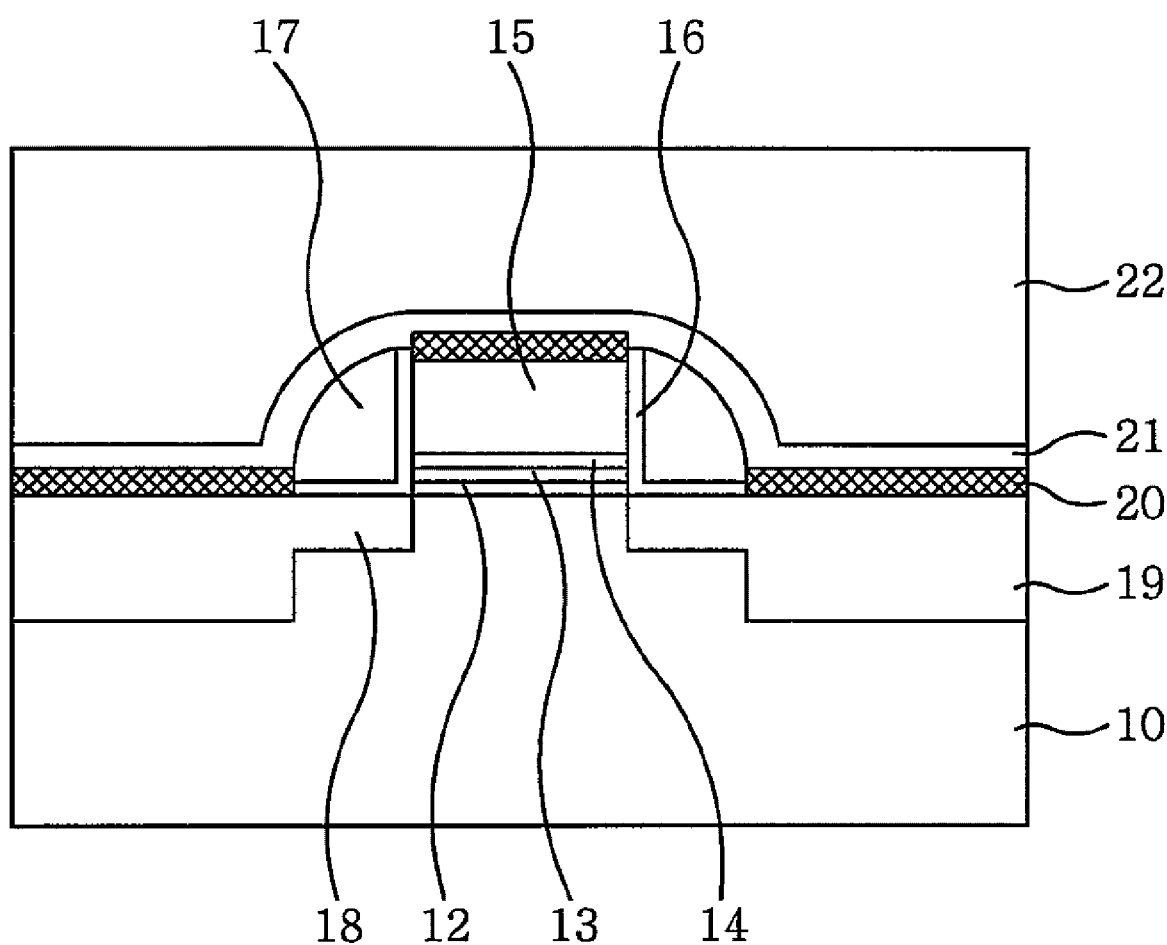
FIG. 1 is a cross-sectional view of a flash memory device of a conventional SONOS structure.
Figure 2A:
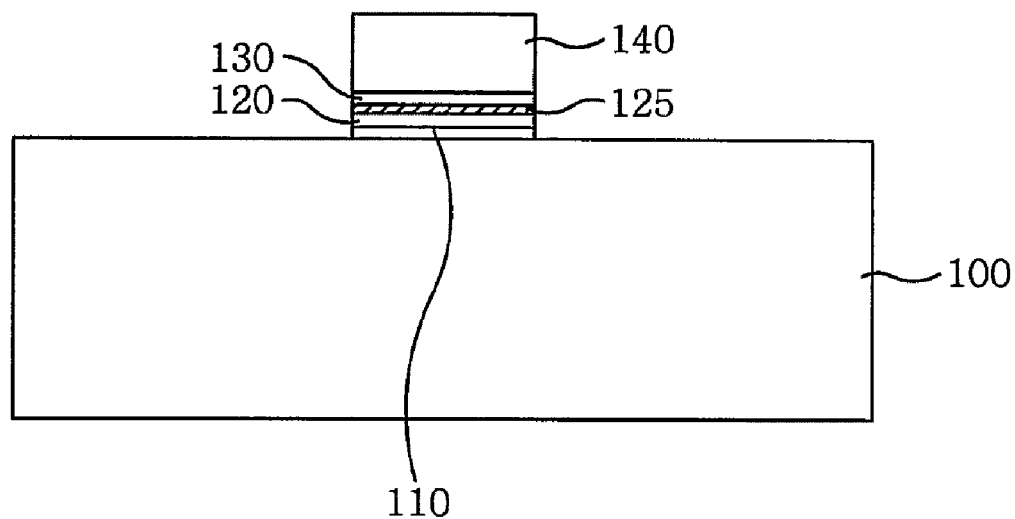
FIGS. 2A to 2D are cross-sectional views illustrating a method for fabricating a flash memory device of a SONOS structure in accordance with an embodiment of the present invention.

Referring to FIG. 2A, an ion implantation process for forming a well region in a semiconductor substrate 100 and an ion implantation process for threshold voltage control may be carried out.

A tunnel oxide layer 110, a trap nitride layer 120, and a block oxide layer 130 may be stacked over the semiconductor substrate 100, forming an ONO layer. The tunnel oxide layer 110 and the trap nitride layer 120 can be formed by thermally oxidizing the semiconductor substrate 100 or can be formed by a deposition method such as chemical vapor deposition (CVD).

In one embodiment, after the tunnel oxide layer 110 and the trap nitride layer 120 are deposited in-situ, the surface of the trap nitride layer 120 can be oxidized to a predetermined thickness in-situ in the same equipment as that used to form the tunnel oxide layer 110 and the trap nitride layer 120. Alternatively, the trap nitride layer 120 may be oxidized ex-situ in equipment different from that used to form the tunnel oxide layer 110 and the trap nitride layer 120. For example, a furnace or rapid thermal processing (RTP) equipment can be used.

A block oxide layer 130 can be then formed by thermally oxidizing the surface of the trap nitride layer 120 to a predetermined thickness or by employing CVD together with the tunnel oxide layer 110 and the trap nitride layer 120.

The surface of the trap nitride layer 120 may be oxidized after formation of the tunnel oxide layer 110 and the trap nitride layer 120 in order to remove incomplete states existing on the surface of the trap nitride layer 120. The block oxide layer 130 may then be formed over the resulting intermediate oxide layer 125. Thus, incomplete states, such as dangling bonds, interface states, shallow traps, and defects, at the interface of the trap nitride layer 120 and the block oxide layer 130 can be reduced. Accordingly, not only can program and erase characteristics of the SONOS device be stabilized, but also a retention ability, a durability characteristic, and the yield and reliability of the SONOS device can be improved.

A conductive material such as polysilicon (not shown) for forming a gate may be deposited on the block oxide layer 130 of the ONO layer. The polysilicon layer, and the block oxide layer 130, the trap nitride layer 120, and the tunnel oxide layer 110 of the ONO layer may be selectively removed through photolithography and etch processes, thus forming a gate electrode 140. After the gate electrode 140 is formed a cleaning process may then be carried out.

Figure 2B:
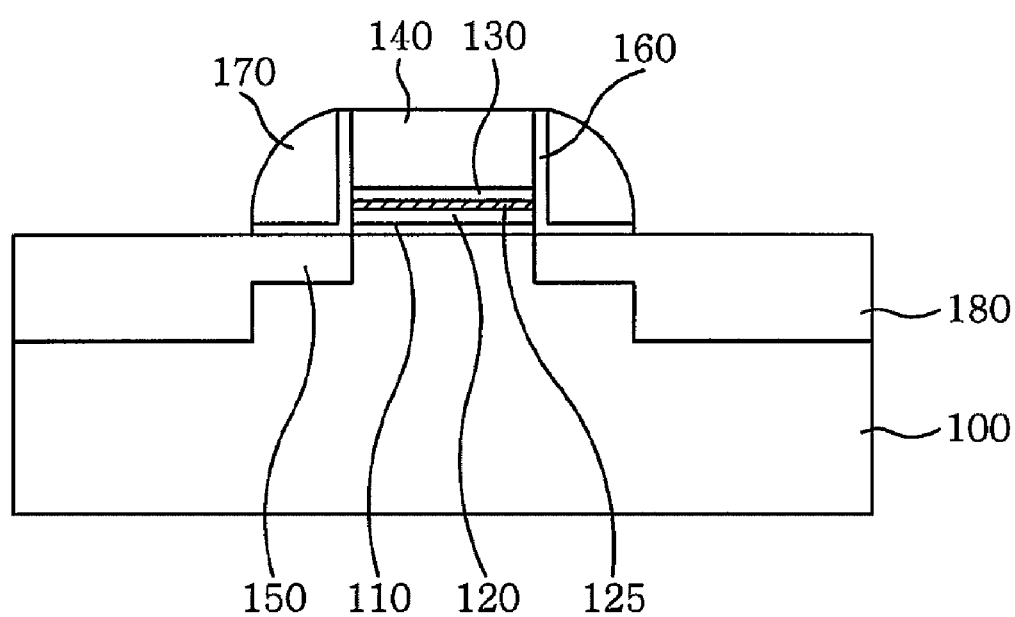

Referring to FIG. 2B, low-concentration impurity ions may be implanted into the entire surface of the semiconductor substrate 100 by using the gate electrode 140 as a mask, thus forming a LDD region 150 in the surface of the semiconductor substrate 100 on both sides of the gate electrode 140.

First and second insulating layers may be formed over the entire surface of the semiconductor substrate 100 including the gate electrode 140. An etch-back process may then be performed to form first and second insulating layer sidewalls 160 and 170 on both sidewalls of the gate electrode 140.

High-density impurity ions may be implanted into the entire surface of the semiconductor substrate 100 by using the gate electrode 140 and the first and second insulating layer sidewalls 160 and 170 as a mask, thus forming a source/drain impurity region 180 connected to the LDD region 150 formed in the surface of the semiconductor substrate 100.

Figure 2C:
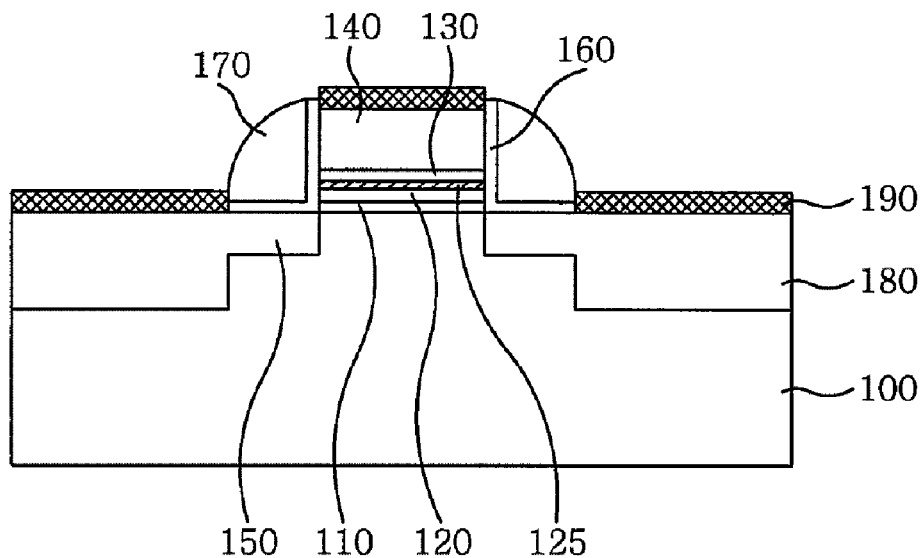

Referring to FIG. 2C, metal, such as nickel, may be deposited over the entire surface of the semiconductor substrate 100 including the gate electrode 140 by a physical vapor deposition (PVD) or CVD method, thus forming a metal layer.

A capping layer, such as Ti, TiN or Ti/TiN, may optionally be formed on the metal layer.

The metal layer can be formed to a thickness of 50 to 300 angstrom, and preferably 150 to 300 angstrom. The capping layer of Ti/TiN, formed on the metal layer, can be formed to a thickness of 100 to 400 angstrom, and preferably 200 to 400 angstrom at a deposition temperature of 100° C. to 300° C., and preferably 150° C. to 300° C.

In certain exemplary embodiments, nickel may be used as the metal. However, another metal, such as cobalt (Co), titanium (Ti), tungsten (W), tantalum (Ta) or molybdenum (Mo), can be used instead of or in combination with nickel.

Annealing may be performed on the semiconductor substrate 100 having the metal layer at a temperature of 300° C. to 500° C., and preferably 350° C. to 500° C. for 10 seconds to 2 minutes, thus forming a nickel silicide (NiSi) layer 190 on the gate electrode 140, the LDD region 150, and the source/drain impurity region 180.

The nickel layer that has not reacted to the gate electrode 140 and the semiconductor substrate 100 may be removed through wet etch.

Figure 2D:
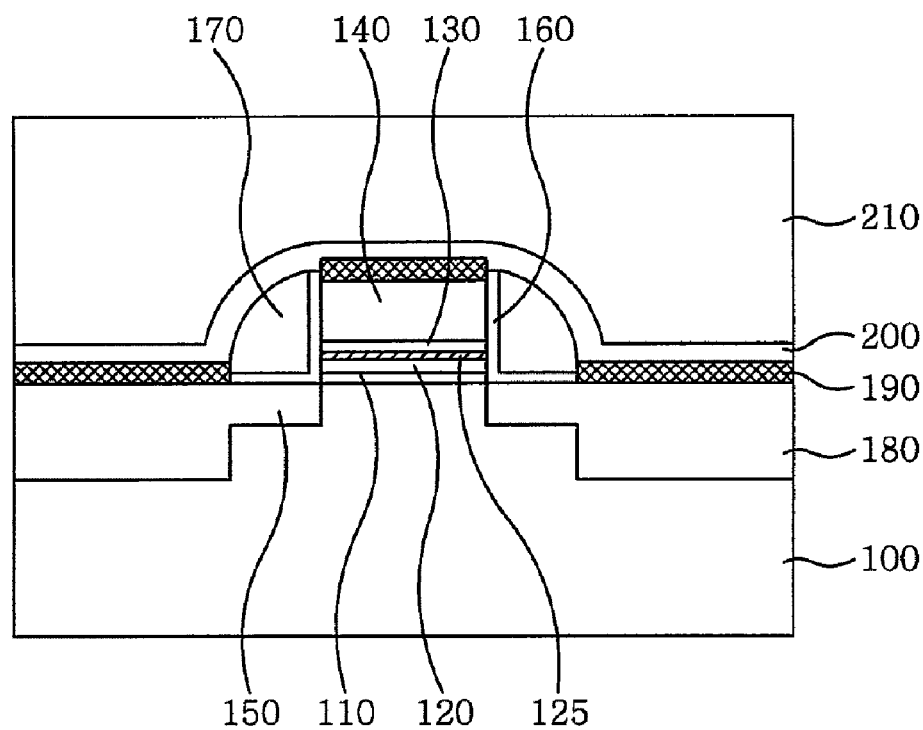

Referring to FIG. 2D, an etch-stop layer 200 may be formed over the entire surface of the semiconductor substrate 100 including the gate electrode 140. A PMD layer 210 may be formed on the etch-stop layer 200.

A densification process may be performed on the PMD layer 210 under $H_2$ or $N_2/H_2$ atmosphere instead of the conventional $N_2$ atmosphere.

As described above, the densification process may be performed on the PMD layer 210 under $H_2$ or $N_2/H_2$ atmosphere. Thus, hydrogen can easily infiltrate the ONO layer of the SONOS device, increasing a probability of the infiltrated hydrogen being combined with dangling bonds, shallow traps and/or interface traps existing within the ONO layer of the SONOS device or at the interface of the ONO layer and the semiconductor substrate. Accordingly, the electrical properties of the SONOS device can be stabilized and the yield and reliability of the SONOS device can be improved.

In order to further increase the infiltration of hydrogen and the coupling efficiency, the densification process can be performed by raising the existing process pressure (approximately 1 atmosphere or less) to about 1 to 10 atmospheres.

An exemplary densification process of the PMD layer can be carried out as follows.

After the PMD layer 210 is formed, the densification process can be performed by employing furnace annealing under $H_2$ atmosphere at a temperature of 600° C. to 900° C. for 10 minutes to 5 hours, and preferably 750° C. to 900° C. for 10 minutes to 3 hours or can be performed by using RTA under $H_2$ atmosphere at a temperature of 700° C. to 1000° C. for 10 to 60 seconds, and preferably 850° C. to 1000° C. for 10 to 60 seconds.

A pressure of the $H_2$ atmosphere can generally range from 1 Torr to 1 atmosphere. However, in order to increase the infiltration of $H_2$ and the coupling efficiency, a pressure of one atmospheric pressure or more (1 to 10 atmospheres), and preferably 1 to 6 atmospheres, can be used.

Alternatively, after the PMD layer 210 is formed, the densification process can be performed by employing furnace annealing under $H_2/N_2$ atmosphere at a temperature of 600° C. to 900° C. for 10 minutes to 5 hours or can be performed by using RTA under $H_2/N_2$ atmosphere at a temperature of 700° C. to 1000° C. for 10 to 60 seconds.

A pressure of the $H_2/N_2$ atmosphere can generally range from 1 Torr to 1 atmosphere. However, in order to increase the infiltration of $H_2$ and the coupling efficiency, a pressure of one atmospheric pressure or more (1 to 10 atmospheres) can be used.

Alternatively, after the PMD layer 210 is formed, the densification process can be performed in multiple stages or steps with a different atmosphere used in each step. For example, the process can be performed under $H_2$ atmosphere at an early stage and then under $H_2/N_2$ atmosphere, or can be performed under $H_2/N_2$ atmosphere at an early stage and then under $N_2$ atmosphere. Employing furnace annealing, the densification process may be performed at a temperature of 600° C. to 900° C. for 10 minutes to 5 hours.

Other combinations are also possible. Alternative examples of different annealing steps can include: an $H_2/N_2$ anneal followed by an $H_2$ anneal, an $H_2$ anneal followed by an $H_2/N_2$ anneal, an $N_2$ anneal followed by an $H_2$ anneal, an $H_2$ anneal followed by an $N_2$ anneal, an $N_2$ anneal followed by an $H_2$ or $N_2$ anneal, and the like. In each combination of atmospheres, the densification process may be performed at a temperature of 600° C. to 900° C. for 10 minutes to 5 hours.

Similarly, RTA can instead be performed, with each of the above combinations of annealing steps, at a temperature of 700 to 1000 degrees Celsius for 10 to 60 seconds. Furthermore, the RTA process time can be divided into several steps in the same manner as the furnace anneal process time, wherein the process can be performed under one atmosphere (e.g., $N_2$ or $H_2/N_2$) at an early stage and then performed under another atmosphere (e.g., $H_2/N_2$ or $N_2$).

A pressure applied in each annealing step can generally range from 1 Torr to 1 atmosphere. However, in order to increase the infiltration of $H_2$ and the coupling efficiency, a pressure of one atmospheric pressure or more (1 to 10 atmospheres) can be used.

As described above, after a PMD layer is formed, a densification process may be carried out under $H_2$ or $N_2/H_2$ atmosphere. Thus, hydrogen can easily infiltrate an ONO layer of a SONOS device, increasing a probability of the infiltrated hydrogen being combined with dangling bonds, shallow traps and/or interface traps, existing within the ONO layer of the SONOS device or at the interface of the ONO layer and a semiconductor substrate. Accordingly, the electrical properties of the SONOS device can be stabilized and the yield and reliability of the SONOS device can be improved.

While the invention has been shown and described with respect to the specific embodiments, it will be understood by those skilled in the art that various changes and modifications may be made without departing from the spirit and scope of the invention as defined in the following claims.

What is claimed is:

1. A method for fabricating a flash memory device, comprising the steps of:
   forming an oxide/nitride/oxide (ONO) layer over a semiconductor substrate;
   forming a gate electrode on the ONO layer;
   forming a source/drain impurity region in a surface of the semiconductor substrate on both sides of the gate electrode;
   forming a pre-metal dielectric (PMD) layer over an entire surface of the semiconductor substrate including the gate electrode; and
   performing a densification process for densifying the PMD layer under a gas atmosphere,
   wherein the densification process is performed under one of $H_2$ and $N_2/H_2$ atmospheres and then performed under the other of the $H_2$ and $N_2/H_2$ atmospheres.

2. The method of claim 1, wherein the densification process is performed by employing furnace annealing at a temperature of 600° C. to 900° C. for 10 minutes to 5 hours.

3. The method of claim 1, wherein the densification process is performed under 1 Torr to 1 atmosphere.

4. The method of claim 1, wherein the densification process is performed under 1 atmosphere to 10 atmospheres.

5. The method of claim 1, wherein the step of forming the ONO layer comprises the steps of:
   sequentially forming a tunnel oxide layer and a trap nitride layer over the semiconductor substrate;
   forming an intermediate oxide layer on a surface of the trap nitride layer by oxidizing the surface of the trap nitride layer; and
   forming a block oxide layer on the intermediate oxide layer.

6. The method of claim 5, wherein the step of forming the gate electrode comprises the steps of:
   forming a conductive material on the block oxide layer; and
   selectively removing the conductive material, the block oxide layer, the intermediate oxide layer, the trap nitride layer, and the tunnel oxide layer to form the gate electrode.

7. The method of claim 5, wherein the intermediate oxide layer is formed through oxidization in-situ in the same equipment as that used to form the tunnel oxide layer and the trap nitride layer after the tunnel oxide layer and the trap nitride layer are formed.

8. The method of claim 5, wherein the intermediate oxide layer is formed through oxidization ex-situ in a different equipment from that used to form the tunnel oxide layer and the trap nitride layer after the tunnel oxide layer and the trap nitride layer are formed.

9. The method of claim 5, wherein the tunnel oxide layer and the trap nitride layer are formed by a growth process.

10. The method of claim 5, wherein the tunnel oxide layer and the trap nitride layer are formed by a deposition process.

11. A method for fabricating a flash memory device, comprising the steps of:
    forming an oxide/nitride/oxide (ONO) layer over a semiconductor substrate;
    forming a gate electrode on the ONO layer;
    forming a source/drain impurity region in a surface of the semiconductor substrate on both sides of the gate electrode;

forming a pre-metal dielectric (PMD) layer over an entire surface of the semiconductor substrate including the gate electrode; and performing a densification process for densifying the PMD layer under a gas atmosphere, wherein the densification process is performed under one of $N_2$ and $N_2/H_2$ atmospheres and then performed under the other of the $N_2$ and $N_2/H_2$ atmospheres.

12. A method for fabricating a flash memory device, comprising the steps of:

forming an oxide/nitride/oxide (ONO) layer over a semiconductor substrate;

forming a gate electrode on the ONO layer;

forming a source/drain impurity region in a surface of the semiconductor substrate on both sides of the gate electrode;

forming a pre-metal dielectric (PMD) layer over an entire surface of the semiconductor substrate including the gate electrode; and performing a densification process for densifying the PMD layer under a gas atmosphere, wherein the densification process is performed under one of $N_2$ and $H_2$ atmospheres and then performed under the other of the $N_2$ and $H_2$ atmospheres.

* * * * *